United States Patent
Tsai et al.

(10) Patent No.: US 10,395,937 B2
(45) Date of Patent: Aug. 27, 2019

(54) FIN PATTERNING FOR SEMICONDUCTOR DEVICES

(71) Applicant: Taiwan Semiconductor Manufacturing Co., Ltd., Hsinchu (TW)

(72) Inventors: Tzung-Yi Tsai, Taoyuan (TW); Yen-Ming Chen, Hsin-chu County (TW); Dian-Hau Chen, Hsinchu (TW); Han-Ting Tsai, Kaoshiung (TW); Tsung-Lin Lee, Hsinchu (TW); Chia-Cheng Ho, Hsinchu (TW); Ming-Shiang Lin, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 15/689,334

(22) Filed: Aug. 29, 2017

(65) Prior Publication Data
US 2019/0067020 A1  Feb. 28, 2019

(51) Int. Cl.
*H01L 21/308* (2006.01)
*H01L 21/311* (2006.01)
*H01L 27/092* (2006.01)
*H01L 21/3115* (2006.01)

(52) U.S. Cl.
CPC ...... *H01L 21/3081* (2013.01); *H01L 21/3086* (2013.01); *H01L 21/31111* (2013.01); *H01L 21/31116* (2013.01); *H01L 21/31155* (2013.01); *H01L 27/0924* (2013.01)

(58) Field of Classification Search
CPC ........... H01L 21/3081; H01L 21/31116; H01L 21/31111; H01L 21/3086; H01L 21/31155; H01L 29/6656; H01L 29/66795; H01L 21/823431; H01L 21/30604
See application file for complete search history.

(56) References Cited

U.S. PATENT DOCUMENTS

| 5,312,781 A | 5/1994 | Gregor et al. |
| 8,728,332 B2 | 5/2014 | Lin et al. |
| 8,796,666 B1 | 8/2014 | Huang et al. |
| 8,822,243 B2 | 9/2014 | Yan et al. |
| 8,987,142 B2 | 3/2015 | Lee et al. |

(Continued)

FOREIGN PATENT DOCUMENTS

| KR | 20170041847 A | 4/2017 |
| TW | 201729292 A | 8/2017 |

*Primary Examiner* — Bilkis Jahan
*Assistant Examiner* — Victor V Barzykin
(74) *Attorney, Agent, or Firm* — Haynes and Boone, LLP

(57) ABSTRACT

A method of forming a semiconductor device is disclosed. The method includes providing a device having a substrate and a hard mask layer over the substrate; forming a mandrel over the hard mask layer; depositing a material layer on sidewalls of the mandrel; implanting a dopant into the material layer; performing an etching process on the hard mask layer using the mandrel and the material layer as an etching mask, thereby forming a patterned hard mask layer, wherein the etching process concurrently produces a dielectric layer deposited on sidewalls of the patterned hard mask layer, the dielectric layer containing the dopant; and forming a fin by etching the substrate using the patterned hard mask layer and the dielectric layer collectively as an etching mask.

20 Claims, 14 Drawing Sheets

(56) References Cited

U.S. PATENT DOCUMENTS

| | | |
|---|---|---|
| 9,093,530 B2 | 4/2015 | Huang et al. |
| 9,053,279 B2 | 6/2015 | Chang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,589,958 B1 * | 3/2017 | Kanakasabapathy ........................ H01L 27/0924 |
| 9,685,440 B1 * | 6/2017 | Cheng ................. H01L 27/0886 |
| 9,887,135 B1 * | 2/2018 | Wallner .......... H01L 21/823437 |
| 10,083,839 B2 * | 9/2018 | Cheng ................ H01L 21/3088 |
| 2011/0021010 A1 * | 1/2011 | Cheng ................ H01L 21/2236 438/513 |
| 2014/0248778 A1 * | 9/2014 | Moll ................ H01L 21/02107 438/696 |
| 2016/0020109 A1 | 1/2016 | Yoo |
| 2016/0056269 A1 * | 2/2016 | Lee ................... H01L 29/66795 438/424 |
| 2016/0163555 A1 * | 6/2016 | Jang ................ H01L 21/823456 438/587 |
| 2016/0307803 A1 * | 10/2016 | Mun ............... H01L 21/823431 |
| 2016/0365286 A1 * | 12/2016 | Basker ............ H01L 21/823412 |
| 2017/0033103 A1 | 2/2017 | Cheng et al. |
| 2017/0213825 A1 | 7/2017 | Kanakasabapathy et al. |

\* cited by examiner

FIN PATTERNING FOR SEMICONDUCTOR DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. N-type FinFETs and p-type FinFETs may have different material compositions in respective fins (e.g., Si in fins of n-type FinFET and SiGe in fins of p-type FinFET), which enhances carrier mobility of both types of FinFETs and improves device performance. However, fin width control during the fin patterning can be challenging. For example, fins with different material compositions suffer from different lateral losses during fabrication, resulting in inconsistent fin widths between n-type FinFETs and p-type FinFETs. Therefore, although conventional fin patterning methods have been generally adequate for their intended purposes, they are not satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
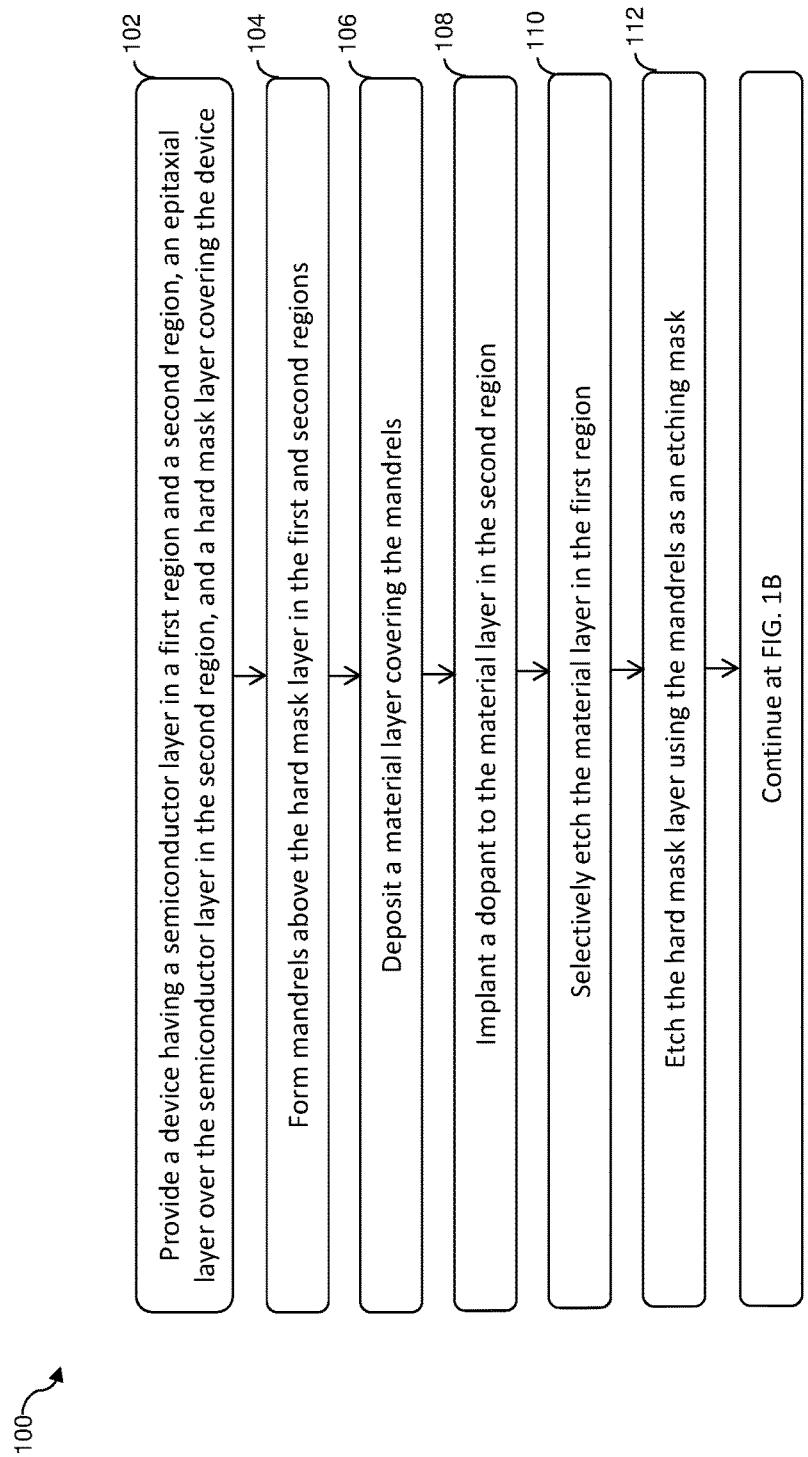
FIGS. 1A and 1B show a flow chart of a method of fabricating a semiconductor device, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure is generally related to semiconductor devices and fabrication. More particularly, some embodiments are related to patterning fins during the fabrication of fin field-effect transistors (FinFETs). It is an objective of the present disclosure to provide methods for effectively maintaining fin width fidelity between n-type FinFETs and p-type FinFETs.

Channel regions for an n-type field-effect transistor (NFET) and a p-type field-effect transistor (PFET) may include different semiconductor materials. For example, with the recognition of materials having higher hole mobility than that of silicon, there is a desire to replace silicon as the p-type channel material. Epitaxial region with semiconductor materials other than silicon may be formed above a silicon substrate to provide p-type channels for PFETs. Exemplary materials include germanium (Ge), silicon germanium (SiGe), III-V materials such as GaAs, InP, InGaAs, InAs, combinations thereof, and/or other suitable materials. As an example, in one semiconductor device, a fin for an n-type FinFET may include silicon (Si) and a fin for a p-type FinFET may include silicon germanium (SiGe).

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

However, during the fin patterning, the different semiconductor materials in an NFET fin and a PFET fin would exhibit different etch rate to an etchant and suffer from different lateral losses in fin widths. Other steps in the fin patterning, such as a fin cleaning process, may also cause different lateral losses. Consequently, an NFET fin and a PFET fin may have different fin widths. For example, a PFET fin with silicon germanium may become narrower than an NFET fin with silicon due to silicon germanium's relatively higher etching rate during an etching process and relatively higher oxidization loss during a fin cleaning process. Semiconductor devices with inconsistent fin width among NFETs and PFETs may suffer from poor short channel performance and reduced process windows, such as a reduced poly gate fill window.

Embodiments of the present disclosure offer various advantages, though it is understood that other embodiments may offer different advantages, not all advantages are necessarily discussed herein, and no particular advantage is required for all embodiments. In at least some embodiments, an NFET fin and a PFET fin are maintained substantially the same fin width, leading to improved short channel performance and enlarged process windows.

Figure 1B:
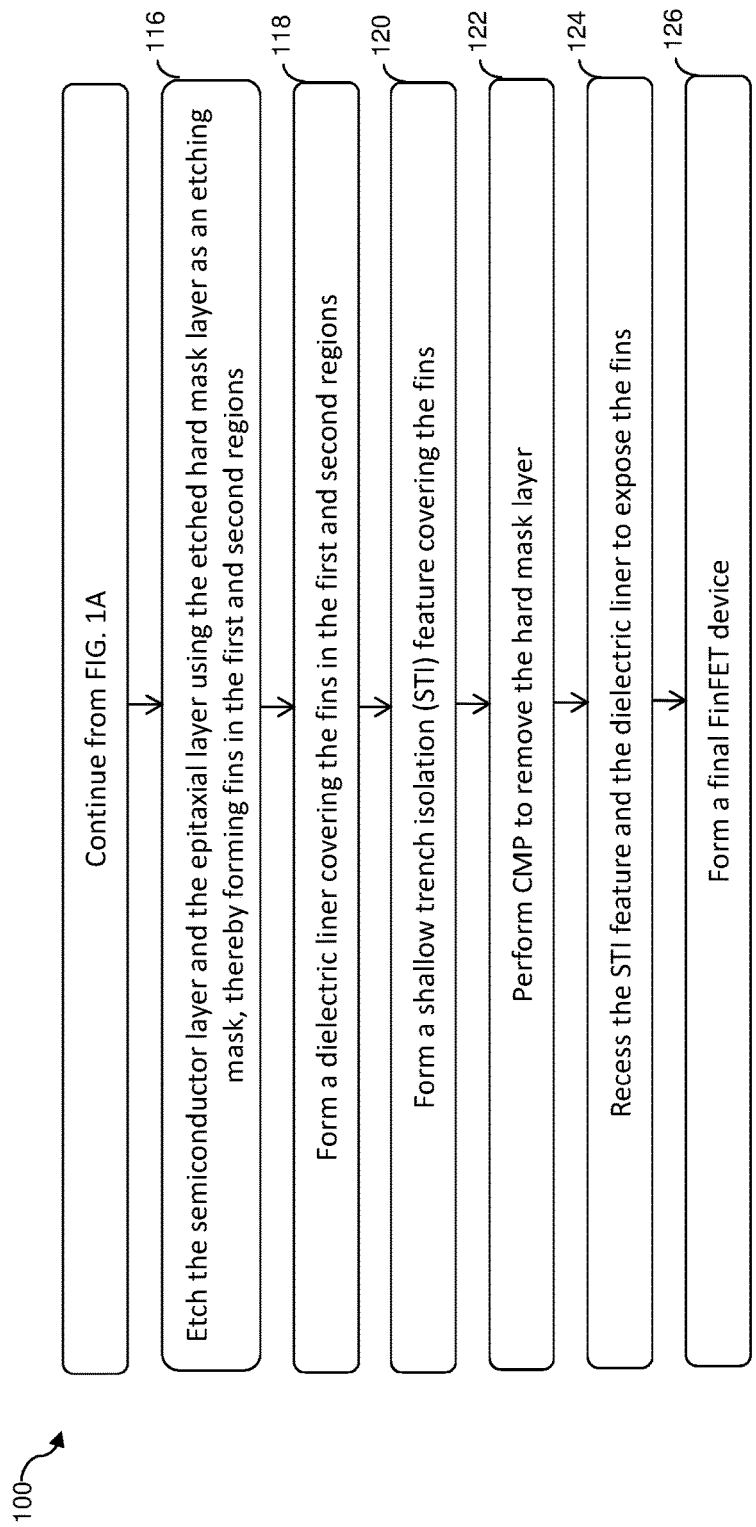

FIGS. 1A and 1B show a flow chart of a method 100 of fabricating a semiconductor device, such as a FinFET device, according to various aspects of the present disclosure. Additional steps can be provided before, during, and after the method 100, and some of the steps described can be replaced or eliminated for other embodiments of the method 100. The method 100 is described below in conjunction with FIGS. 2-13. FIGS. 2-13 show exemplary cross-sectional views of a semiconductor device 200 at various stages of the method 200.

The semiconductor device 200 may be an intermediate device fabricated during processing of an integrated circuit (IC), or a portion thereof, that may comprise static random access memory (SRAM) and/or logic circuits, passive components such as resistors, capacitors, and inductors, and active components such as FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Figure 2:
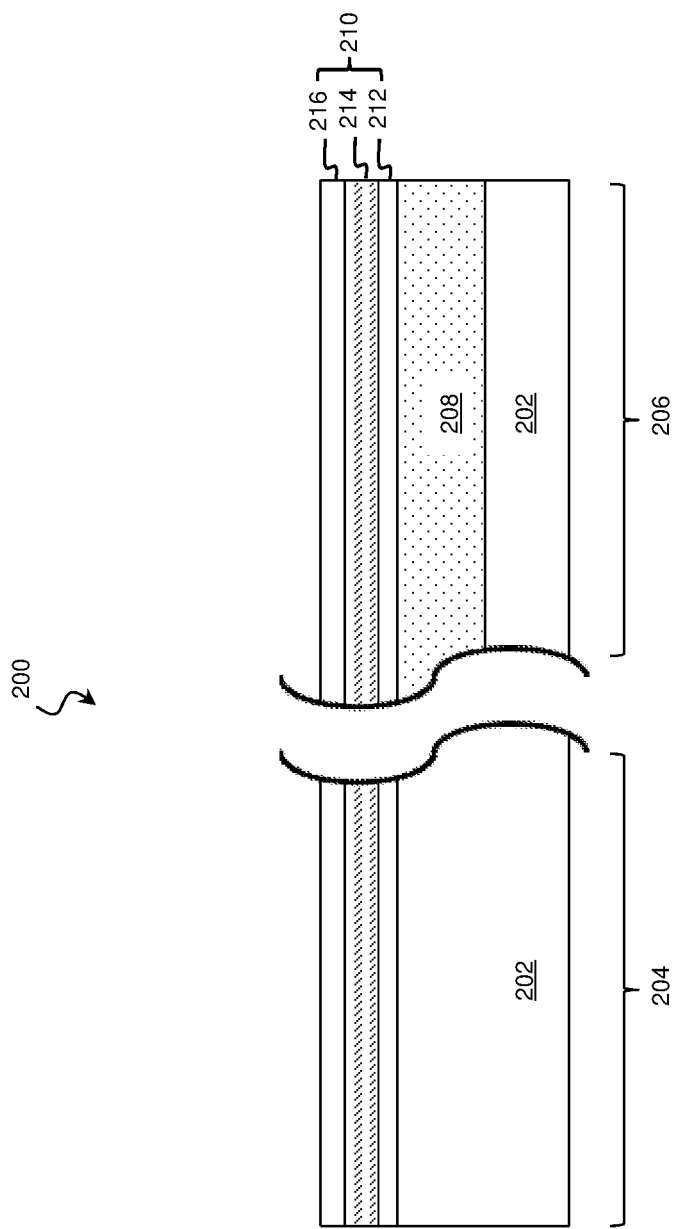
FIGS. 2, 3, 4, 5, 6, 7, 8, 9, 10, 11, 12, and 13 are cross-sectional views of a semiconductor device at various stages of the method of FIGS. 1A and 1B, according to various aspects of the present disclosure.

Referring first to block 102 of FIG. 1A and to FIG. 2, a semiconductor device 200 is provided that includes a substrate 202. In an embodiment, the substrate 202 is silicon in a crystalline structure. Other exemplary materials include other elementary semiconductors such as germanium, or compound semiconductors such as silicon germanium, silicon carbide, gallium arsenic, gallium phosphide, indium phosphide, indium arsenide, and/or indium antimonide.

The substrate 202 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates. In some such examples, a layer of the substrate 202 may include an insulator such as a silicon oxide, a silicon nitride, a silicon oxynitride, a silicon carbide, and/or other suitable insulator materials.

The semiconductor device 200 further includes a first region 204 and a second region 206 upon which fins for NFETs and PFETs are to be formed. The first region 204 includes the substrate 202. The second region 206 includes the substrate 202 extending from the region 204 and an epitaxial layer 208 formed above the substrate 202. Therefore, the second region 206 may be referred to as an epitaxy region. In the illustrated embodiment, the first region 204 is a region defined for one or more NFETs and the second region 206 is a region defined for one or more PFETs. It is understood that the semiconductor device 200 may alternatively have a PFET form in the first region 204 and an NFET to form in the second region 206.

The epitaxial layer 208 and the substrate 202 include dissimilar crystalline materials. In the illustrated embodiment, the epitaxial layer 208 includes silicon germanium and the substrate 202 includes silicon. In another embodiment, the epitaxial layer 208 includes germanium or III-V materials such as GaAs, InP, InGaAs, and/or InAs, and the substrate 202 include other suitable materials. The epitaxial layer 208 may be referred to as the epitaxial semiconductor layer 208. Due to different crystalline lattice sizes of the semiconductor materials, when one kind of semiconductor material is epitaxially grown on a substrate of another kind of semiconductor material, the stacked structure is often referred to as a heterostructure. Hetero-integration of dissimilar semiconductor materials, for example, germanium, silicon germanium, or III-V compounds, with silicon substrate, is an attractive path to increasing hole mobility in PFETs while maintaining the need of keeping silicon substrates as a fabrication vehicle.

Forming the epitaxial semiconductor layer 208 may include a variety of processes such as etching and epitaxial growing. The etching process recesses a portion of the substrate 202 in the second region 206 to form a trench. To recess the substrate 202, the etching processes may include any suitable etching technique such as wet etching, dry etching, Reactive Ion Etching (RIE), ashing, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF), potassium hydroxide (KOH) solution, ammonia, a solution containing hydrofluoric acid (HF), nitric acid ($HNO_3$), and/or acetic acid ($CH_3COOH$), or other suitable wet etchant. In an embodiment, the trench depth is between about 50 nm and about 500 nm. The epitaxial growing process deposits the epitaxial semiconductor layer 208 in the trench. The epitaxial semiconductor layer 208 can be epitaxially grown in any suitable epitaxial deposition system, including, but not limited to, atmospheric-pressure CVD (APCVD), low pressure CVD (LPCVD), ultra-high-vacuum CVD (UHVCVD), by molecular beam epitaxy (MBE), or by atomic layer deposition (ALD). In the CVD process, epitaxial growth typically includes introducing a source gas into the chamber. The source gas may include at least one precursor gas and a carrier gas, such as hydrogen. The reactor chamber is heated, such as, by RF-heating. In an embodiment, the growth temperature in the chamber ranges from about 300° C. to about 900° C., depending on the composition of the epitaxial semiconductor layer 208. The epitaxial growth system also may utilize low-energy plasma to enhance the layer growth kinetics. The epitaxial growth system may be a single-wafer or multiple-wafer batch reactor.

To ensure the epitaxial semiconductor layer 208 fills the trench entirely, the epitaxial semiconductor layer 208 may be overgrown. In one example, the overgrown portions the epitaxial semiconductor layer 208 is above the top surface of the substrate 202 in the first region 204 by about 100 nm to about 1000 nm. After the epitaxial growth of the epitaxial semiconductor layer 208, a polishing process, such as a chemical mechanical polishing (CMP) process, may be performed to remove the overgrown portions and planarize the top surface of the semiconductor device 200. After the polishing process, the top surface of the substrate 202 in the first region 204 and the top surface of the epitaxial semiconductor layer 208 in the second region 206 are substantially coplanar.

Various other material layers can be formed above the semiconductor device 200. In the illustrated embodiment, a hard mask 210 to be patterned to define fins is formed above the substrate 202 in the first region 204 and above the epitaxial semiconductor layer 208 in the second region 206. The hard mask 210 may further include multiple layer structures, such as a tri-layer stack, which includes a bottom layer 212, a middle layer 214, and an upper layer 216. It will be recognized that the semiconductor device 200 may have any number of material layers, masking layers, sacrificial layers, resist layers and/or other layers formed upon it. Suitable materials for these layers may be selected, in part, based on etchant selectivity. For example, in the tri-layer stack, the bottom layer 212, the middle layer 214, and the upper layer 216 may be structured to have different materials, such that each layer can be removed using a corresponding etchant without significant etching of the other layers. In some implementations, the bottom layer 212, the middle layer 214, and the upper layer 216 include different semiconductor materials and/or different dielectric materials to achieve desired etching selectivity, such as silicon, amorphous silicon, silicon oxide, silicon nitride, silicon oxynitride (SiON)), silicon carbide, other semiconductor material, and/or other dielectric material. In an embodiment, the bottom layer 212 includes silicon oxide, the middle layer 224 includes silicon nitride, and the upper layer 226 includes silicon oxide. Each layer of the tri-layer stack can be formed by any suitable process, such as thermal oxidation, chemical vapor deposition (CVD) or a spin-on-glass process.

Figure 3:
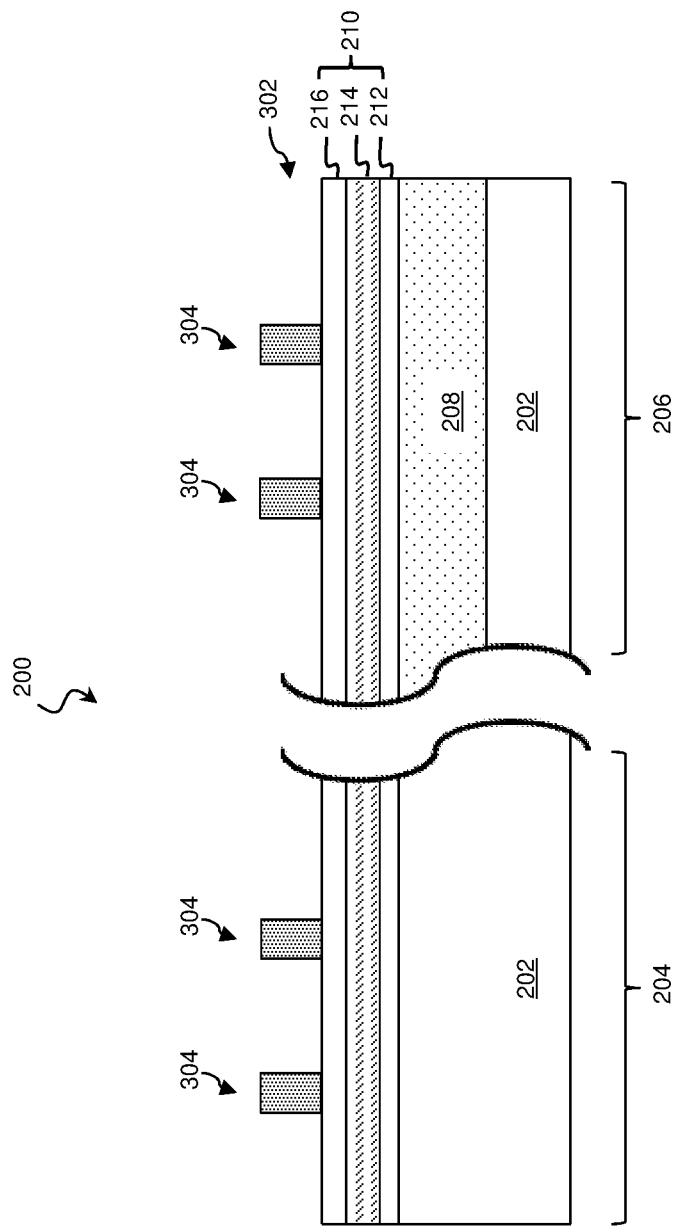

Referring to block 104 of FIG. 1A and to FIG. 3, a mandrel layer 302 is formed above the hard mask 210, which includes a plurality of mandrels 304. In the illustrated embodiment, the width of the mandrels 304 is substantially uniform. The mandrels 304 are to define the fins in both regions 204 and 206 in subsequent processes. The mandrels 304 may include a dielectric such as silicon oxide, silicon nitride, silicon oxynitride, and/or silicon carbide, and in the illustrated embodiment, the mandrels 304 includes silicon nitride.

In some embodiments, the mandrels 304 are formed by depositing and patterning a mandrel layer 302. The mandrel layer 302 may be deposited to any suitable thickness and by any suitable process including chemical vapor deposition (CVD), high-density plasma CVD (HDP-CVD), physical vapor deposition (PVD), atomic-layer deposition (ALD), and/or other suitable deposition processes. Subsequently, the mandrel layer 302 may be patterned to form the mandrels 304 by a photolithography process and an etching process. The etching process removes portions of the mandrel layer 302 exposed by a patterned photoresist layer formed above. After etching the mandrel layer 302, the patterned photoresist layer may be removed. In some embodiments, the mandrels 304 are formed as spacers alongside a patterned sacrificial layer using a self-aligned process. The patterned sacrificial layer is thereafter removed by an etching process.

In various examples, etching process may include wet etching, dry etching, RIE, ashing, and/or other etching methods using etchant chemistries such as carbon tetrafluoride ($CF_4$), difluoromethane ($CH_2F_2$), trifluoromethane ($CHF_3$), other suitable etchants, and/or combinations thereof. In an example, the etching process includes an anisotropic etch such as a plasma etch.

In the illustrated embodiment, the mandrel layer 302 includes two mandrels 304 in the first region 204 and another two mandrels 304 in the second region 206, although in further examples, the mandrel layer 302 may include any number of mandrels 304 with any suitable spacing within any respective regions.

Figure 4:
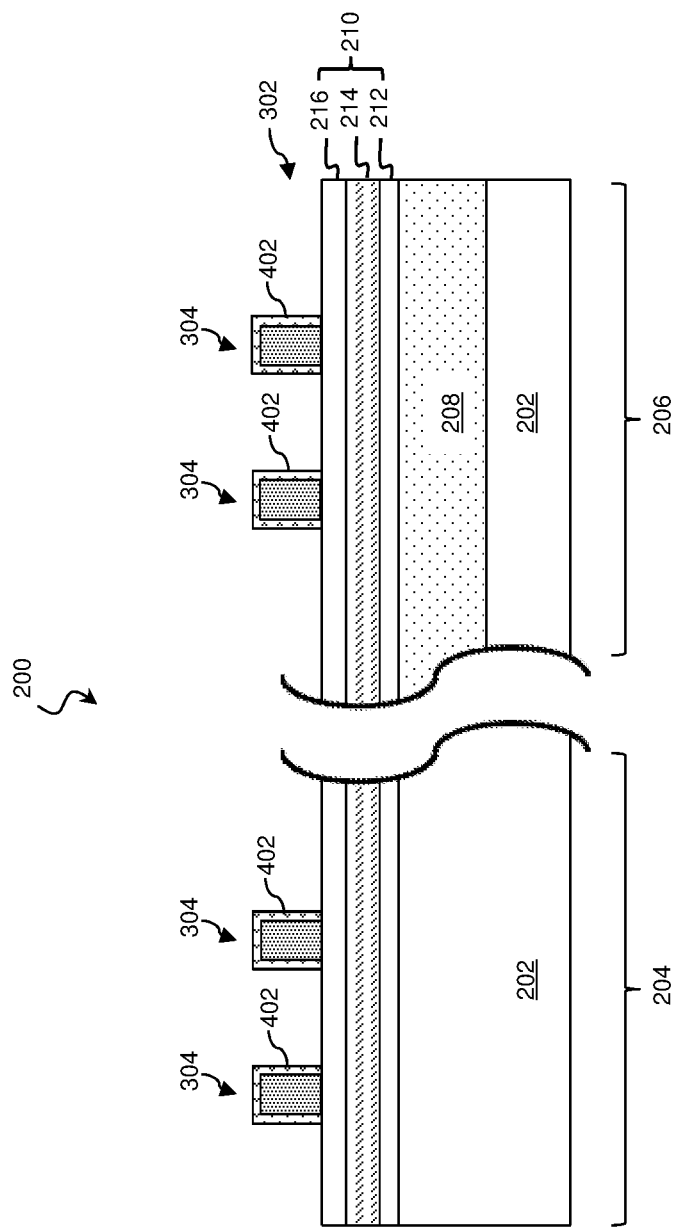
Figure 5:
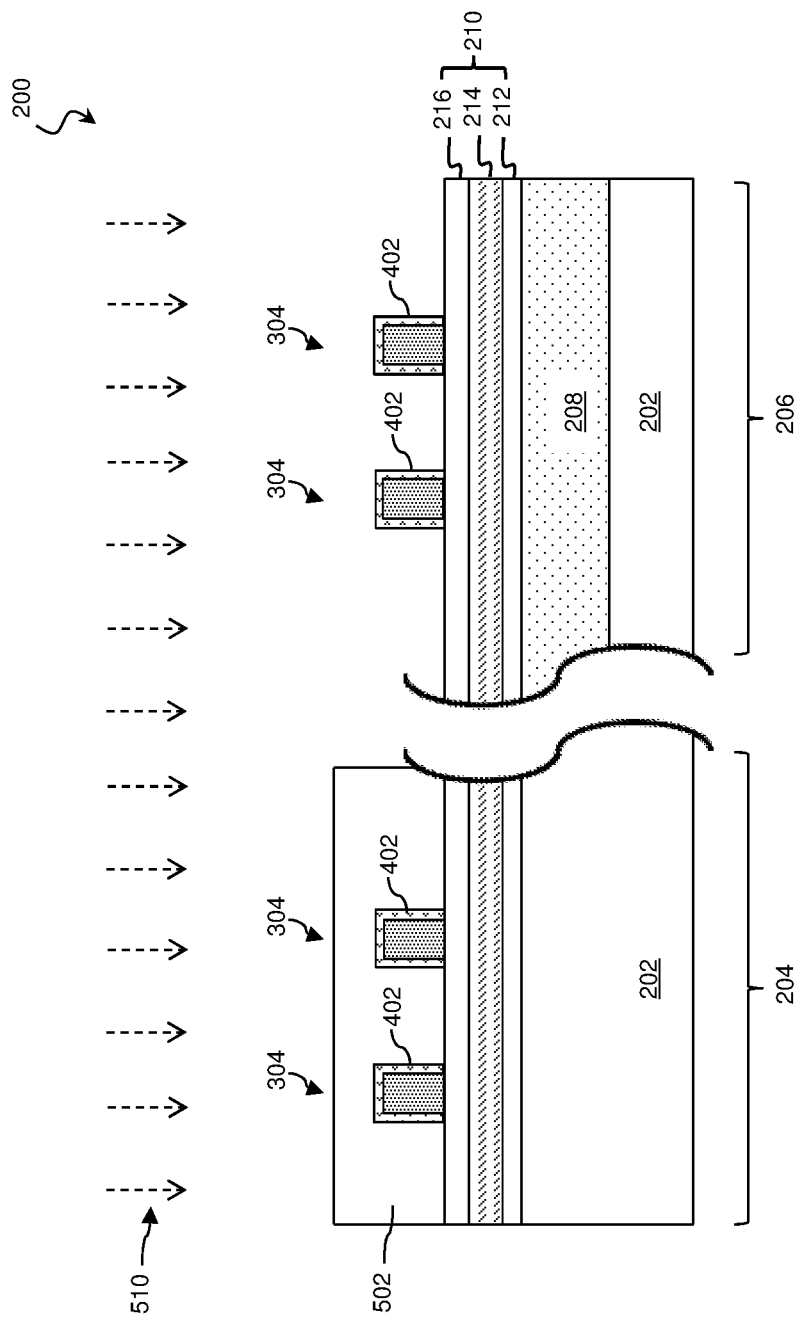

Referring to block 106 of FIG. 1A and to FIG. 4, a material layer 402 is deposited to cover the mandrels 304. The material layer 402 may include any suitable material (e.g., amorphous silicon, silicon oxide, silicon nitride, silicon oxynitride, silicon carbide, etc.), and may be selected to have a different etchant selectivity than the mandrels 304. In an example, the material layer 402 includes amorphous silicon.

The material layer 402 may be deposited by any suitable process including CVD, HDP-CVD, ALD, PVD, and/or other suitable deposition techniques. In some embodiments, the material layer 402 is deposited conformally by CVD or ALD and an anisotropic (directional) etching technique such as an anisotropic plasma etching, is performed to remove portions of the material layer 402 deposited on horizontal surfaces of the hard mask 210. In this way, portions of the material layer 402 deposited on the vertical surfaces of the mandrels 402 remain. In some embodiments, etching the material layer 402 from the horizontal surfaces of the hard mask 210 also removes the material layer 402 from the horizontal surfaces of the mandrels 304. In some other embodiments, the material layer 402 still remains on the horizontal surfaces of the mandrels 304. As an example, the thickness of the material layer 402 on sidewalls of the mandrels 304 is between about 0.5 nm and about 5 nm, by way of example and not intended to be limiting. In the illustrated embodiment, the thickness of the material layer 402 is about 2 nm.

The material layer 402 may be used to widen the mandrels 304 in the second region 206 relative to the mandrels 304 in the first region 204 by removing it from the first region 204. Referring to block 108 of FIG. 1A and to FIG. 5, the material layer 402 in the second region 206 is heavily doped with an impurity (dopant) 510, which causes etch selectivity of the material layer 402 in the regions 204 and 206 to differ and allows the material layer 402 in the first region 204 to be removed later on in an etching process. In an example, a photoresist layer (or a resist layer) 502 is first deposited over both regions 204 and 206. A lithographic exposure may be performed on the semiconductor device 200 to expose the second region 206 to radiation. After exposure, a developer is applied to the photoresist layer 502 to remove the portion covering the second region 206 while leaving the portion covering the first region 204. After the second region 206 is uncovered, the impurity 510 may be doped into the material layer 402 through an implantation process. In the second region 206, the impurity 510 may also be driven into portions of the mandrels 304 under the material layer 402, while the hard mask 210 may serve as a capping layer to substantially block the impurity 510 from being further driven into the epitaxial semiconductor layer 208 beneath. Meanwhile, the photoresist layer 502 substantially blocks the impurity 510 from being driven into the first region 204. Consequently, in the first region 204, the material layer 402, portions of the mandrels 304 under the material layer 402, the hard mask 210, and the substrate 202 beneath are substantially free of the impurity 510.

In an embodiment, the material layer 402 in the second region 206 is heavily doped with a p-type dopant with a dopant concentration larger than $2\times10^{20}$ cm$^{-3}$, such as in a range from about $2\times10^{20}$ cm$^{-3}$ to about $5\times10^{21}$ cm$^{-3}$. The impurity concentration is selected such that the doped material layer 402 and the undoped material layer 402 have high etch selectivity that in turn allows the undoped material layer 402 to be removed by a suitable etchant without etching (or without significantly etching) the doped material layer 402. For example, the etch selectivity between amorphous silicon (a-Si) and a-Si doped with boron increases with higher concentration of boron, when etchant is an ammonium hydroxide (NH$_4$OH) based solution. In a specific example, when the boron concentration in a-Si is $1\times10^{20}$ cm$^{-3}$, the etch selectivity between undoped a-Si and doped a-Si may be less than 2.5:1; when the boron reaches a concentration of about $2\times10^{20}$ cm$^{-3}$ or higher, the etch selectivity between undoped a-Si and doped a-Si may sharply increase to higher than 10:1; while when the boron reaches a concentration of about $3\times10^{20}$ cm$^{-3}$ or higher, the etch selectivity between the undoped a-Si and doped a-Si may further increase to higher than 25:1. Still referring to FIG. 5, in the illustrated embodiment, the material layer 402 is a-Si and the impurity 510 is boron with a concentration at about $2\times10^{21}$ cm$^{-3}$.

After the implantation process, the photoresist layer 502 is removed to expose the first region 204. The photoresist layer 502 may be removed, cleaned, or stripped with methods including dry methods, such as dry ashing or plasma ashing, and wet methods, such as solvent stripping.

Figure 6:
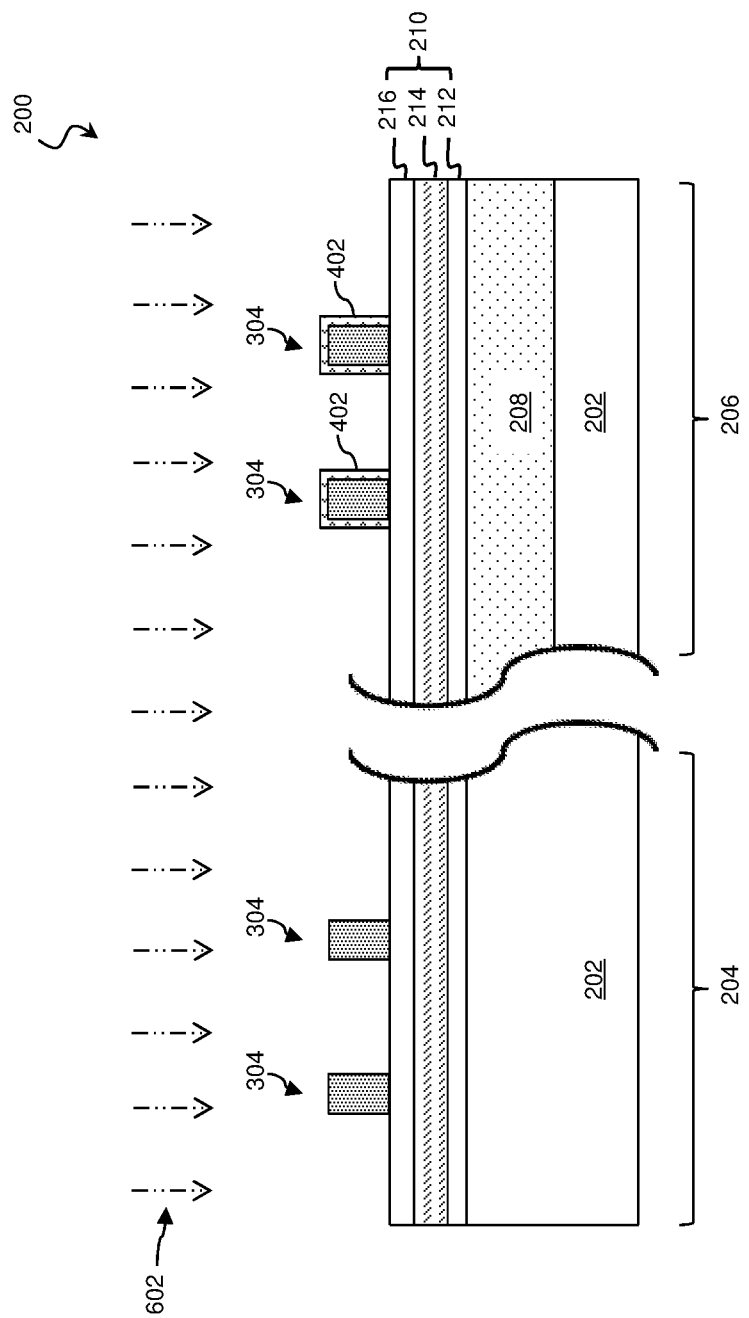

Referring to block 110 of FIG. 1A and to FIG. 6, the undoped material layer 402 in the first region 204 is removed. The removal of the undoped material layer 402 may be a selective etching process, including any suitable etching technique such as wet etching, dry etching, and/or other etching methods. The etchant is selected that it etches the undoped material layer 402 in the first region 204, while the doped material layer 402 in the second region 206 substantially remains unchanged. In the illustrated embodiment, the selective etching process includes a wet etching with an ammonium hydroxide (NH$_4$OH) based solution as an etchant. After the block 110, the mandrels 304 in the second region 206 have larger width than the mandrels 304 in the first region 204 by at least the extra thickness of the doped material layer 402, which will offset a portion of the lateral loss when the pattern in the mandrels 304 is transferred to the epitaxial semiconductor layer 208 to define fins.

Figure 7:
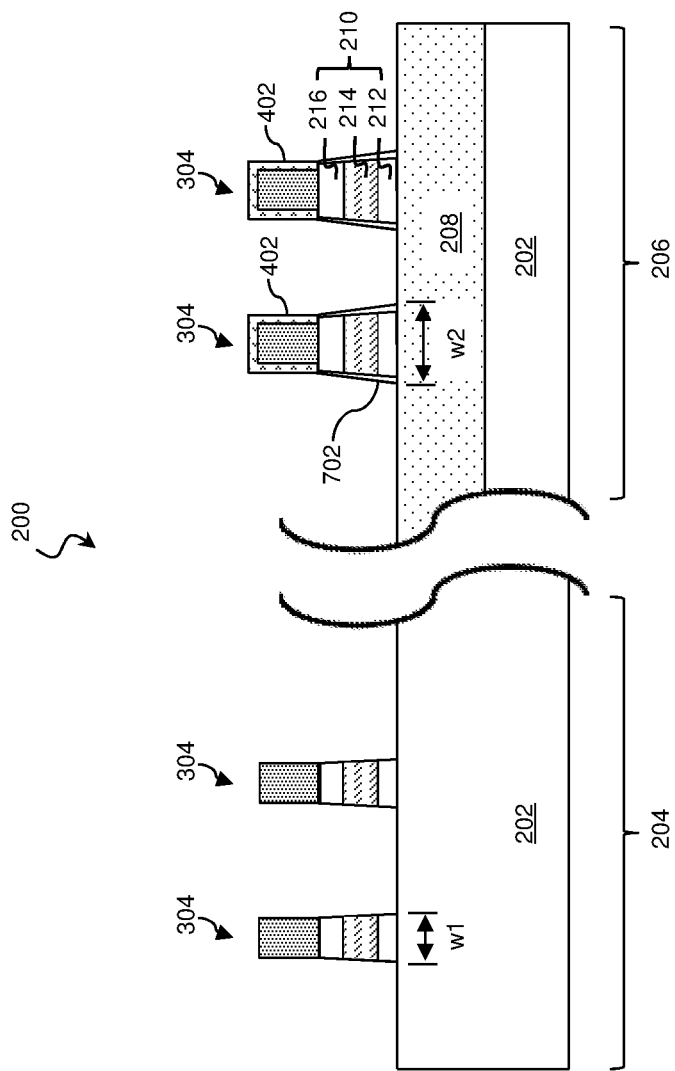

Referring to block 112 of FIG. 1A and to FIG. 7, the hard mask 210 is etched using the mandrels 304 as an etching mask. The etching processes may include any suitable etching technique such as wet etching, dry etching, RIE, ashing, and/or other etching methods. In some embodiments, etching includes multiple etching steps with different etching chemistries, each targeting a particular material of the hard mask 210 and each selected to resist etching the mandrels 304, the upper layer 216, and the middle layer 214, respectively.

Figure 8:
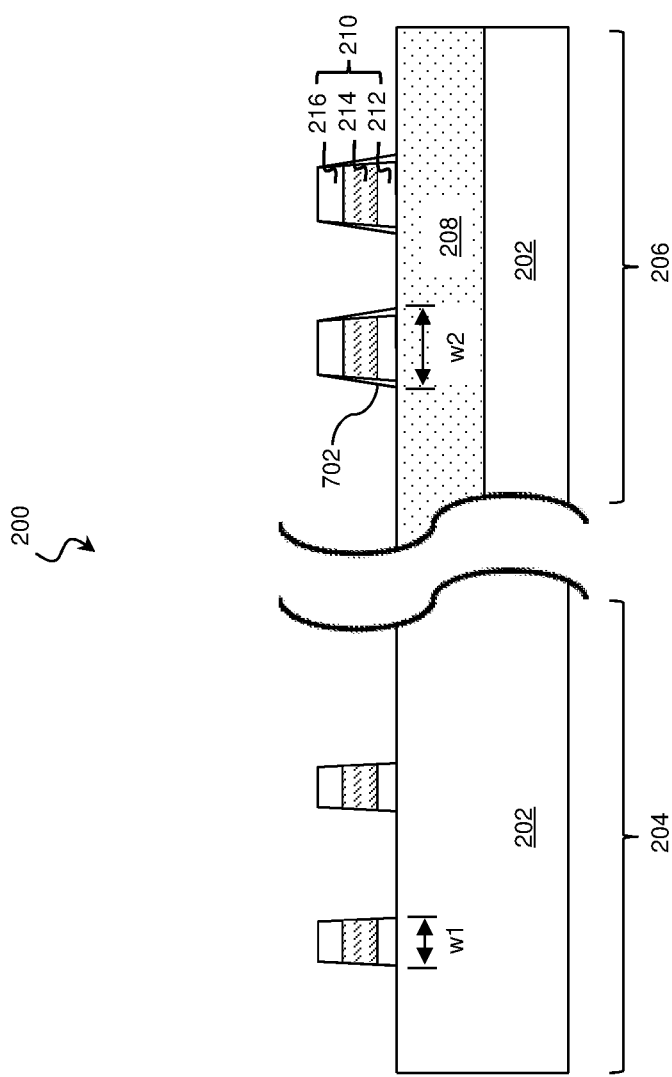

In an embodiment, the etching process is anisotropic and may be performed with a gas mixture of a fluorine-containing gas (e.g., CF$_4$, SF$_6$, CH$_2$F$_2$, CHF$_3$, and/or C$_2$F$_6$) or a chlorine-containing gas (e.g., Cl$_2$, CHCl$_3$, CCl$_4$, and/or BCl$_3$) together with oxygen and/or nitrogen. Other gases may be alternatively or additionally deployed by the etching process. In a furtherance of the embodiment, the gas mixture is at a flow rate of 100 to 380 sccm, a source power of 800 to 2100 W, and a pressure of 5 to 50 mTorr. Particularly, the dry etching process produces one or more byproducts due to chemical reactions between the impurity 510 and the oxygen and/or nitrogen. The impurity 510 is released from the surface of the material layer 402 during the dry etching process. In the illustrated embodiment, the impurity 510 is boron and the byproducts may include boron oxide, boron nitride, and/or boron oxynitride. The boron byproducts are produced simultaneously during the dry etching process and are deposited as a dielectric layer 702 on the sidewalls of the patterned hard mask 210 in the second region 206. As an example, the dielectric layer 702 may fully covers the sidewalls of the patterned hard mask 210. The lateral etching rate of the hard mask 210 in the second region 206 is reduced due to the existence of the dielectric layer 702, resulting in a relatively larger tapering profile of the sidewalls. The patterned hard mask 210 thereby may have a wider bottom portion than a top portion. In an embodiment, the dielectric layer 702 also has a larger thickness at the bottom portion of the sidewalls of the patterned hard mask 210 than that at the top portion. Due to the extra thickness of the material layer 402 and the tapering profile of the sidewalls of the patterned hard mask 210 in the second region 206, the width (w$_2$) of the patterned hard mask 210 in the second region 206 is larger than the width (w$_1$) of the patterned hard mask 210 in the first region 204. The extra width of the patterned hard mask 210 in the second region 206 would offset the larger lateral loss during patterning fins in the epitaxial semiconductor layer 208. In some implementations, the mandrels 304 are removed from both regions 204 and 206 after the pattern in the mandrels 304 has been transferred to the hard mask 210 in the etching process, as shown in FIG. 8.

Figure 9:
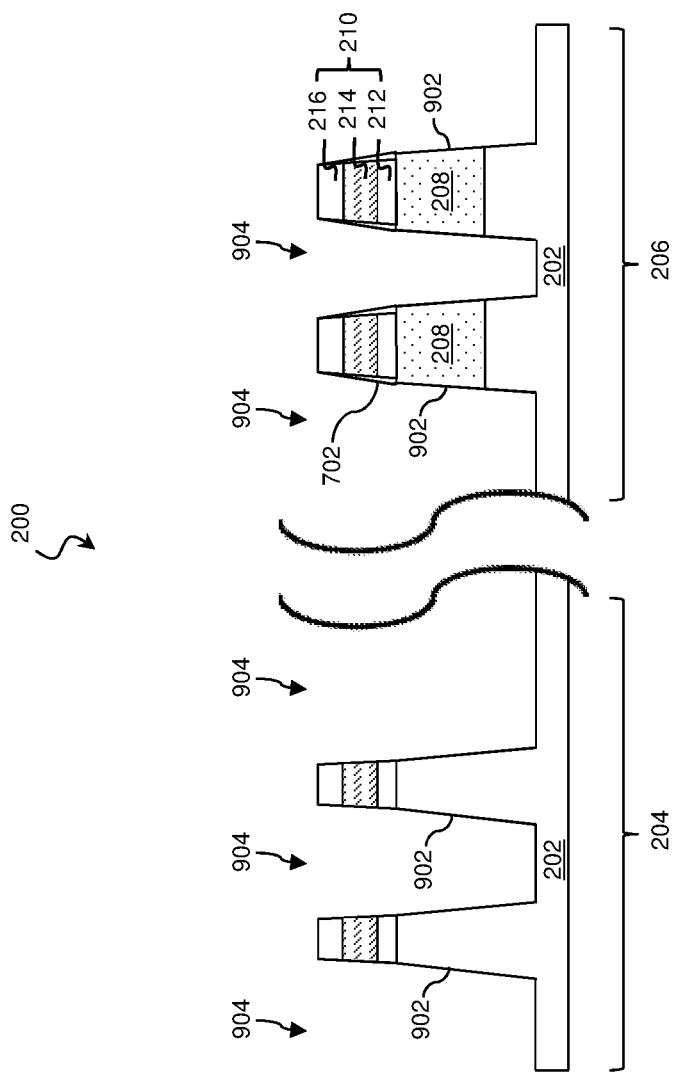

Referring to block 116 of FIG. 2B and to FIG. 9, the substrate 202 in the first region and the epitaxial semiconductor layer 208 and the substrate 202 in the second region are etched using the patterned hard mask 210 to define fins 902. The fins 902 extend from the substrate 202 upwardly in both regions 204 and 206. The etching processes may include any suitable etching technique such as wet etching, dry etching, RIE, ashing, and/or other etching methods. In some embodiments, etching includes multiple etching steps with different etching chemistries, each targeting a particular material layer beneath and each selected to resist etching the hard mask 210 (e.g., the bottom layer 212). For example, a dry etching process may implement an oxygen-containing gas, a fluorine-containing gas (e.g., CF$_4$, SF$_6$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBR$_3$), an iodine-containing gas, other suitable gases and/or plasmas, and/or combinations thereof. For example, a wet etching process may comprise etching in diluted hydrofluoric acid (DHF), potassium hydroxide (KOH) solution, ammonia, a solution containing hydrofluoric acid (HF), nitric acid (HNO$_3$), and/or acetic acid (CH$_3$COOH), or other suitable wet etchant. The remaining portions of the semiconductor layers become the fins 902 in both regions 204 and 206, defining trenches 904 between the fins 902.

During the patterning of the fins 902, the crystalline semiconductor material in the epitaxial semiconductor layer 208 (e.g., SiGe) may have higher etch rate to the etchant than the crystalline semiconductor material in the substrate 202 (e.g., Si) and consequently result in a higher lateral loss. However, since the patterned hard mask 210 is wider in the region 206 than in the region 204, after block 116, the fins 902 in the second region 206 may still have larger width than the fins 902 in the first region 204, in some embodiments. The extra width of the fins 902 in the second region 206 would further offset extra lateral loss of the epitaxial semiconductor layer 208 in subsequent process steps, such as fin cleaning and shallow trench isolation (STI) recess. In some alternative embodiments, after block 116, the fins 902 in both regions 204 and 206 have substantially the same width.

Figure 10:
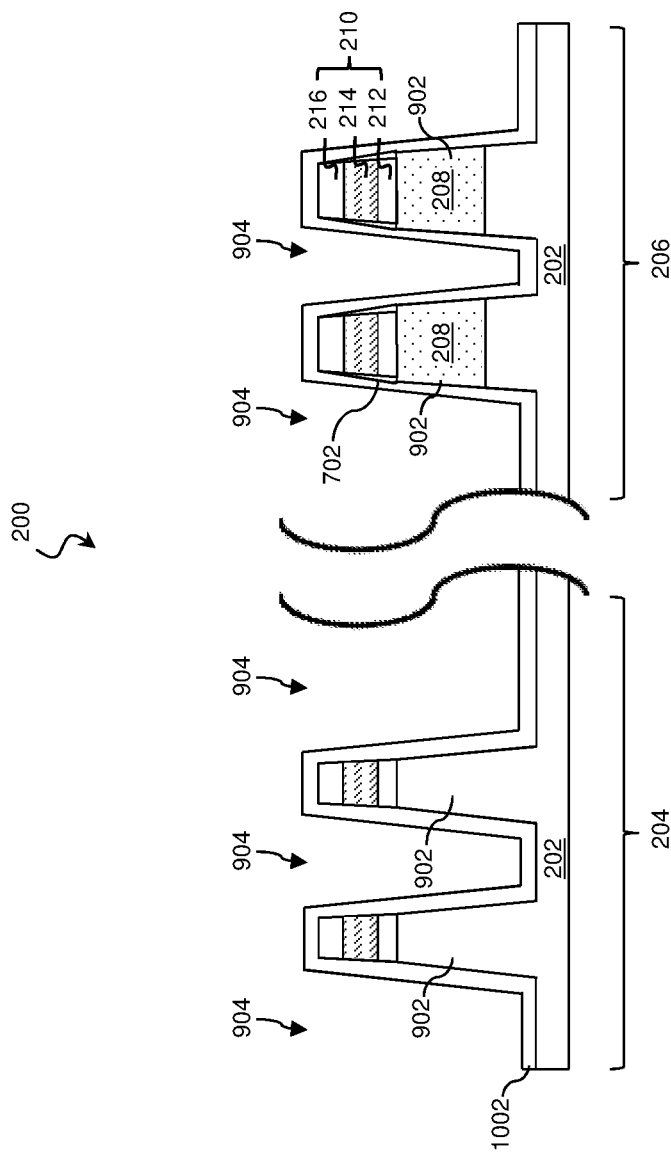

Referring to block 118 of FIG. 2B and to FIG. 10, a dielectric liner 1002 is deposited on the semiconductor device 200, covering the fins 902 in both regions 204 and 206. Prior to the deposition of the dielectric liner 1002, the method 100 may perform one or more surface treatment process to the fins 902. The surface treatment processes are designed to make the surface of the fins 902 to have higher surface bonding affinity with respect to a dielectric material (e.g., silicon nitride). In an embodiment, the surface treatment processes include applying a wet chemical (e.g., a cleaning solution) to the surfaces of the fins 902. For example, the wet chemical may include diluted hydrofluoric acid (DHF). In an embodiment, the surface treatment processes include applying a dry chemical cleaning process (e.g., "Siconi" technology) to the surface of the fins 902. After the surface treatment, it will be easier for the dielectric material in the dielectric liner 1002 to be deposited over the surface of the fins 902. In some embodiments, the dielectric liner 1002 includes a nitride layer configured to provide protection to the fins 902, such as from oxidation. The dielectric liner 1002 may be formed as a blanket layer covering the fins 902 by any suitable technique including CVD, PVD, and ALD. In the illustrated embodiment, the dielectric liner 1002 includes silicon nitride and is deposited by a conformal deposition technique, such as an ALD process.

Figure 11:
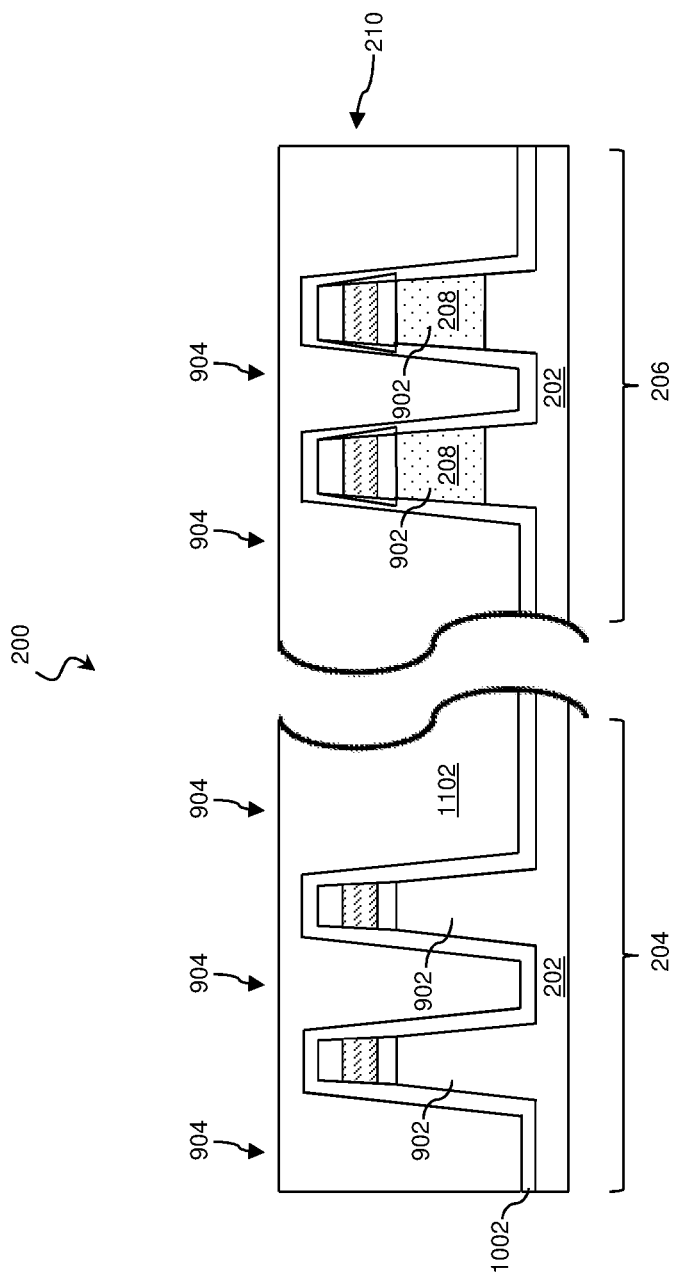

Referring to block 120 of FIG. 1B and to FIG. 11, the trenches 904 are filled with a dielectric material to form an isolation feature 1102, such as a shallow trench isolation feature (STI). Suitable dielectric materials for the isolation feature 1102 include silicon oxides, silicon nitrides, silicon carbides, FluoroSilicate Glass (FSG), low-K dielectric materials, and/or other suitable dielectric materials. The dielectric material may be deposited by any suitable technique including CVD, HDP-CVD, PVD, and/or spin-on techniques. In one such embodiment, a CVD process is used to deposit a flowable dielectric material that includes both a dielectric component and a solvent in a liquid or semiliquid state. The dielectric material may overflow out of the trenches 904 and covers the whole semiconductor device 200. A curing process is used to drive off the solvent, leaving behind the isolation feature 1102 in its solid state.

Figure 12:
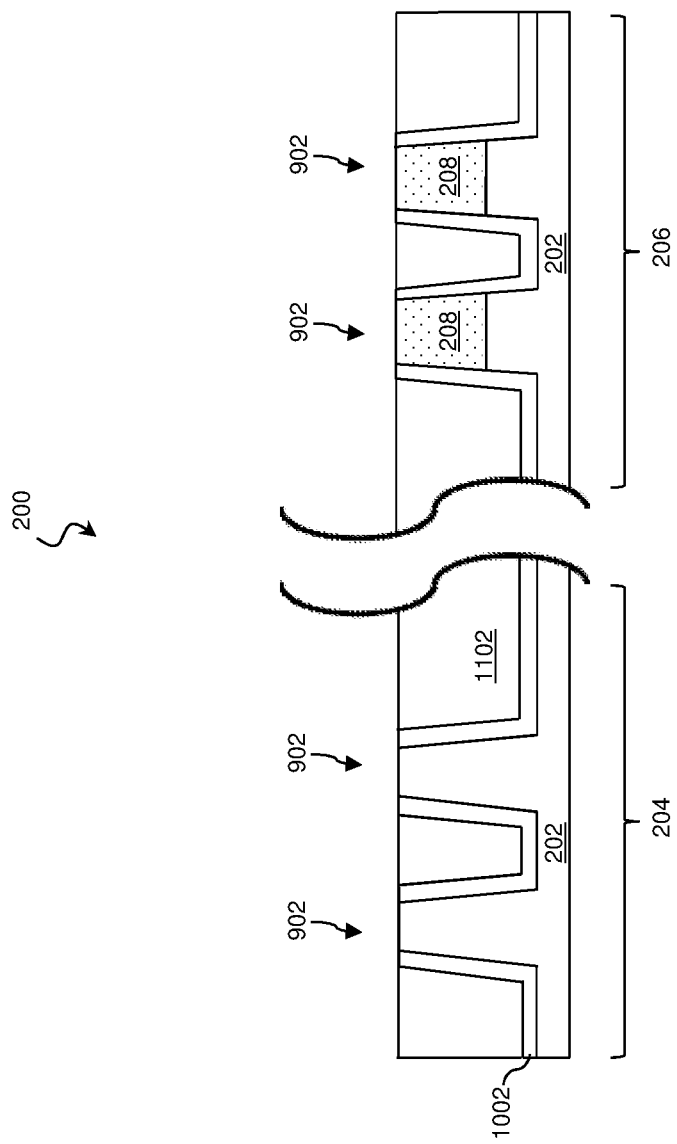

Referring to block 122 of FIG. 1B and to FIG. 12, a polishing operation such as a CMP process is performed to remove the hard mask 210 and excessive portion of the isolation feature 1102, planarizing the top surface of the semiconductor device 200. The top surfaces of the fins 902, such as the semiconductor material of the substrate 202 in the first region 204 and the semiconductor material of the epitaxial semiconductor layer 208 in the second region 206, are exposed.

Figure 13:
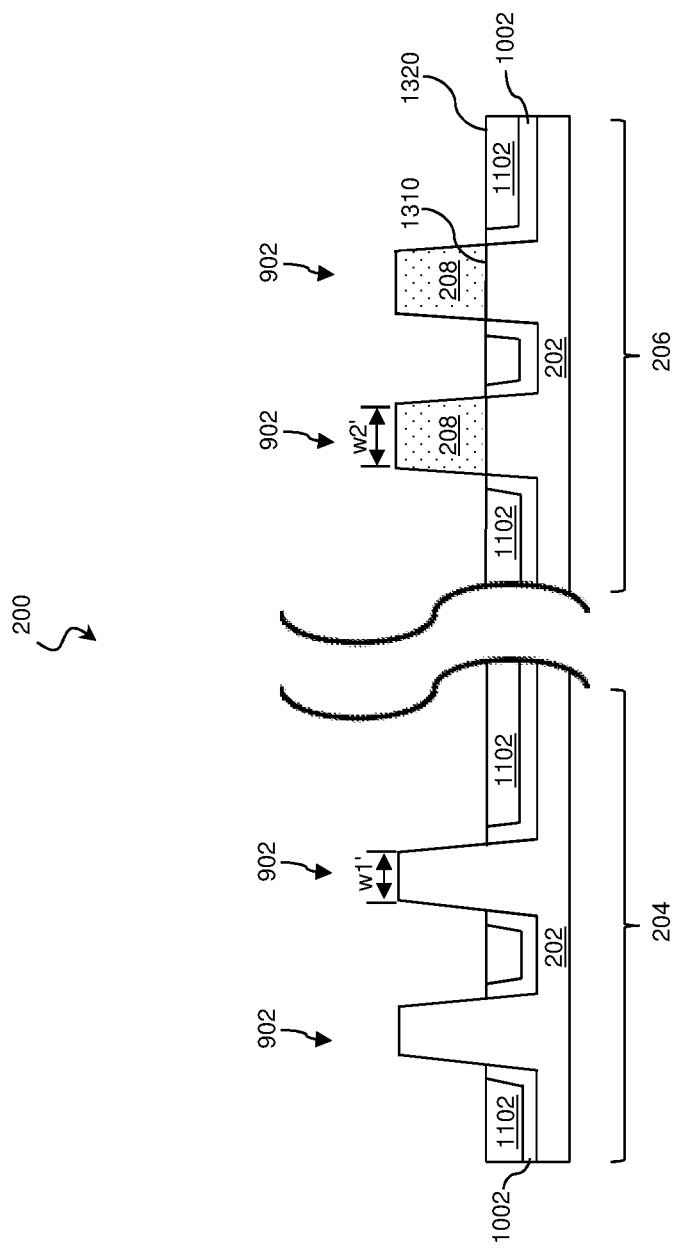

Referring to block 124 of FIG. 1B and to FIG. 13, the method 100 recesses the isolation feature 1102 and the dielectric liner 1002 to expose top portions of the fins. As a result of the block 124, top portions of the fins 902 in both regions 204 and 206 project above the isolation feature 1102, while bottom portions of fins 902 are still surrounded by the dielectric liner 1002 and the isolation feature 1102. Inside the fins 902 in the second region 206, the interface 1310 between the epitaxial semiconductor layer 208 and the substrate 202 may be above or below a top surface 1320 of the isolation feature 1102, in various embodiments. In the illustrated embodiment, the interface 1310 and the top surface 1320 are substantially coplanar. The isolation feature 1102 and dielectric liner 1002 can be recessed by etching in either a single step or in separate etching steps, depending on the material compositions of the isolation feature 1102 and the dielectric liner 1002. Any suitable etching technique may be used to recess the isolation feature 1102 and the dielectric liner 1002, including dry etching, wet etching, RIE, and/or other etching methods. Various etching parameters can be tuned for selective etching, such as etchant composition, etching temperature, etching solution concentration, etching time, etching pressure, source power, RF bias voltage, RF bias power, etchant flow rate, other suitable etching parameters, or combinations thereof. After the etching process to expose the top portions of the fins 902, the width $w_2'$ of the fins 902 in the second region 206 may become substantially the same with the width $w_1'$ of the fins 902 in the first region 204.

Referring to block 126 of FIG. 1B, the method 100 performs further processes to complete the fabrication of the FinFETs, such as n-type FinFETs on fins 902 in the first region 204 and p-type FinFETs on fins 902 in the second region 206. In an embodiment, block 126 forms gate structures over the fins 902 using either a "gate-first" or a "gate-last" process. Further, block 126 may form epitaxial source/drain features in source/drain regions and may form an inter-layer dielectric (ILD) layer over the isolation structure 1102, the fins 902, and the respective gate structures. Further, block 126 may form various conductive features, such as contacts, vias, and interconnects, so as to connect the FinFETs to other portions of the semiconductor device 200 to form a complete integrated circuit.

Although not intended to be limiting, one or more embodiments of the present disclosure provide many benefits to a semiconductor device and the formation thereof, including FinFETs. For example, an NFET fin and a PFET fin of different semiconductor materials may achieve the same fin width during the fin patterning. The improved fin width fidelity enhances device short channel performance and enlarges process windows. Further, the disclosed methods can be easily integrated into existing semiconductor manufacturing processes.

In one exemplary aspect, the present disclosure is directed to a method of forming a semiconductor device. The method includes providing a device having a substrate and a hard mask layer over the substrate; forming a mandrel over the hard mask layer; depositing a material layer on sidewalls of the mandrel; implanting a dopant into the material layer; performing an etching process on the hard mask layer using the mandrel and the material layer collectively as an etching mask, thereby forming a patterned hard mask layer, wherein the etching process concurrently produces a dielectric layer deposited on sidewalls of the patterned hard mask layer, the dielectric layer containing the dopant; and forming a fin by etching the substrate using the patterned hard mask layer and the dielectric layer collectively as an etching mask. In an embodiment, the substrate includes a first semiconductor layer and a second semiconductor layer over the first semiconductor layer, the first and second semiconductor layers having different material compositions; and the etching of the substrate includes etching the second semiconductor layer. In an embodiment, the first semiconductor layer includes silicon; and the second semiconductor layer includes silicon germanium. In an embodiment, the performing of the etching process includes performing a dry etching process with a gas; and the dielectric layer is produced from a chemical reaction between the dopant and the gas. In an embodiment, the dielectric layer has a larger thickness at a bottom portion of the sidewalls of the patterned hard mask layer than at a top portion of the sidewalls of the patterned hard mask layer. In an embodiment, the implanting of the dopant includes implanting boron. In an embodiment, the boron reaches a concentration in the material layer ranging from about $2 \times 10^{20}$ cm$^{-3}$ to about $5 \times 10^{21}$ cm$^{-3}$. In an embodiment, the dielectric layer contains at least one of boron oxide, boron nitride, or boron oxynitride. In an embodiment, the method further includes prior to the forming of the fin, removing the mandrel from the patterned hard mask layer.

In another exemplary aspect, the present disclosure is directed to a method. The method includes providing a substrate; forming a mandrel over the substrate; forming a doped material layer on sidewalls and a top surface of the mandrel; and patterning the substrate by transferring a pattern defined collectively by the mandrel and the doped material layer into the substrate. In an embodiment, the doped material layer contains boron. In an embodiment, the substrate includes an epitaxial semiconductor layer and a hard mask layer over the epitaxial semiconductor layer. In an embodiment, the patterning of the substrate includes etching the hard mask layer using the mandrel and the doped material layer as an etching mask, wherein a dielectric material is produced during the etching of the hard mask layer and deposited on sidewalls of the etched hard mask layer; and etching the epitaxial semiconductor layer using the etched hard mask layer and the dielectric material as an etching mask. In an embodiment, the dielectric material contains at least one of boron oxide, boron nitride, or boron oxynitride. In an embodiment, the dielectric material has a larger thickness at a bottom portion of the sidewalls of the etched hard mask layer than at a top portion of the sidewalls of the etched hard mask layer.

In yet another exemplary aspect, the present disclosure is directed to a method of forming a semiconductor device. The method includes providing a device having a semiconductor layer in a first region and a second region, an epitaxial layer over the semiconductor layer in the second region, and a hard mask layer covering the semiconductor layer in the first region and the epitaxial layer in the second region; forming a first mandrel over the hard mask layer in the first region and a second mandrel over the hard mask layer in the second region; depositing a material layer covering the first and second mandrels; implanting an impurity into the material layer in the second region; removing the material layer in the first region; etching the hard mask layer using the first and second mandrels as an etching mask, resulting in a first etched hard mask feature in the first region and a second etched hard mask feature in the second region; and etching the semiconductor layer and the epitaxial layer using the first and second etched hard mask features as an etching mask, resulting in a first fin in the first region and a second fin in the second region. In an embodiment, the method further includes prior to the implanting of the impurity, depositing a resist layer covering the material layer in the first region; and after the implanting of the impurity, removing the resist layer. In an embodiment, a bottommost portion of the second etched hard mask feature is wider than a bottommost portion of the first etched hard mask feature. In an embodiment, the implanting of the impurity includes implanting boron into the material layer in the second region. In an embodiment, the removing of the material layer in the first region includes applying a wet etchant to the material layer in the first region and the material layer with the impurity in the second region, the wet etchant selectively etching the material layer in the first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a device having a substrate and a hard mask layer over the substrate;
   forming a mandrel over the hard mask layer;
   depositing a material layer on sidewalls of the mandrel;
   implanting a dopant into the material layer;
   performing an etching process on the hard mask layer using the mandrel and the material layer collectively as an etching mask, thereby forming a patterned hard mask layer, wherein the etching process concurrently produces a dielectric layer deposited on sidewalls of the patterned hard mask layer, the dielectric layer containing the dopant; and
   forming a fin by etching the substrate using the patterned hard mask layer and the dielectric layer collectively as an etching mask.

2. The method of claim 1, wherein:
   the substrate includes a first semiconductor layer and a second semiconductor layer over the first semiconductor layer, the first and second semiconductor layers having different material compositions; and
   the etching of the substrate includes etching the second semiconductor layer.

3. The method of claim 2, wherein:
   the first semiconductor layer includes silicon; and
   the second semiconductor layer includes silicon germanium.

4. The method of claim 1, wherein:
   the performing of the etching process includes performing a dry etching process with a gas; and
   the dielectric layer is produced from a chemical reaction between the dopant and the gas.

5. The method of claim 4, wherein the dielectric layer has a larger thickness at a bottom portion of the sidewalls of the patterned hard mask layer than at a top portion of the sidewalls of the patterned hard mask layer.

6. The method of claim 1, wherein the implanting of the dopant includes implanting boron.

7. The method of claim 6, wherein the boron reaches a concentration in the material layer ranging from about $2 \times 10^{20}$ cm$^{-3}$ to about $5 \times 10^{21}$ cm$^{-3}$.

8. The method of claim 6, wherein the dielectric layer contains at least one of boron oxide, boron nitride, or boron oxynitride.

9. The method of claim 1, further comprising:
   prior to the forming of the fin, removing the mandrel from the patterned hard mask layer.

10. A method, comprising:
    providing a substrate;

forming a first set and a second set of mandrels over the substrate;

forming a material layer on sidewalls and a top surface of the first and second sets of mandrels;

implanting a dopant into the material layer over the first set of mandrels to form a doped portion of the material layer, wherein the material layer over the second set of mandrels is free of the dopant; and patterning the substrate by transferring a pattern defined collectively by the first and second sets of mandrels and the doped portion of the material layer into the substrate.

11. The method of claim 10, wherein the dopant includes boron.

12. The method of claim 10, wherein the substrate includes an epitaxial semiconductor layer and a hard mask layer over the epitaxial semiconductor layer.

13. The method of claim 12, wherein the patterning of the substrate includes:

etching the hard mask layer using the first and second sets of mandrels and the doped portion of the material layer as an etching mask, wherein a dielectric material is produced during the etching of the hard mask layer and deposited on sidewalls of the etched hard mask layer; and etching the epitaxial semiconductor layer using the etched hard mask layer and the dielectric material as an etching mask.

14. The method of claim 13, wherein the dielectric material contains at least one of boron oxide, boron nitride, or boron oxynitride.

15. The method of claim 13, wherein the dielectric material has a larger thickness at a bottom portion of the sidewalls of the etched hard mask layer than at a top portion of the sidewalls of the etched hard mask layer.

16. A method of forming a semiconductor device, comprising:

providing a device having a semiconductor layer in a first region and a second region, an epitaxial layer over the semiconductor layer in the second region, and a hard mask layer covering the semiconductor layer in the first region and the epitaxial layer in the second region;

forming a first mandrel over the hard mask layer in the first region and a second mandrel over the hard mask layer in the second region;

depositing a material layer covering the first and second mandrels;

implanting an impurity into the material layer in the second region;

removing the material layer in the first region;

etching the hard mask layer using the first and second mandrels as an etching mask, resulting in a first etched hard mask feature in the first region and a second etched hard mask feature in the second region; and etching the semiconductor layer and the epitaxial layer using the first and second etched hard mask features as an etching mask, resulting in a first fin in the first region and a second fin in the second region.

17. The method of claim 16, further comprising:

prior to the implanting of the impurity, depositing a resist layer covering the material layer in the first region; and after the implanting of the impurity, removing the resist layer.

18. The method of claim 16, wherein a bottommost portion of the second etched hard mask feature is wider than a bottommost portion of the first etched hard mask feature.

19. The method of claim 16, wherein the implanting of the impurity includes implanting boron into the material layer in the second region.

20. The method of claim 16, wherein the removing of the material layer in the first region includes applying a wet etchant to the material layer in the first region and the material layer with the impurity in the second region, the wet etchant selectively etching the material layer in the first region.

* * * * *